United States Patent
Chang et al.

(10) Patent No.: US 9,704,752 B1
(45) Date of Patent: Jul. 11, 2017

(54) FIN FIELD EFFECT TRANSISTOR AND METHOD FOR FABRICATING THE SAME

(71) Applicant: Taiwan Semiconductor Manufacturing Co., Ltd., Hsinchu (TW)

(72) Inventors: Che-Cheng Chang, New Taipei (TW); Chih-Han Lin, Hsinchu (TW); Horng-Huei Tseng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/054,141

(22) Filed: Feb. 26, 2016

(51) Int. Cl.
| H01L 29/78 | (2006.01) |
| H01L 29/06 | (2006.01) |
| H01L 21/8234 | (2006.01) |
| H01L 27/088 | (2006.01) |
| H01L 21/311 | (2006.01) |
| H01L 21/308 | (2006.01) |

(52) U.S. Cl.
CPC .. H01L 21/823431 (2013.01); H01L 21/3083 (2013.01); H01L 21/311 (2013.01); H01L 21/823462 (2013.01); H01L 27/0886 (2013.01)

(58) Field of Classification Search
CPC ......... H01L 27/0886; H01L 21/823431; H01L 21/823821; H01L 21/845; H01L 27/0924; H01L 27/1211; H01L 29/41791; H01L 29/66795; H01L 29/785; H01L 29/0657; H01L 29/7851
See application file for complete search history.

(56) References Cited

U.S. PATENT DOCUMENTS

| 9,559,192 B1* | 1/2017 | Lee | H01L 29/6681 |
| 2007/0176245 A1* | 8/2007 | Kim | H01L 29/66621 257/401 |
| 2007/0278576 A1* | 12/2007 | Kim | H01L 29/66621 257/347 |
| 2008/0023754 A1* | 1/2008 | Baek | H01L 21/823437 257/330 |
| 2008/0057634 A1* | 3/2008 | Lee | H01L 29/66795 438/156 |
| 2009/0111254 A1* | 4/2009 | Yang | H01L 21/823807 438/587 |
| 2009/0278183 A1* | 11/2009 | Lee | H01L 29/41791 257/296 |
| 2012/0091528 A1* | 4/2012 | Chang | H01L 29/7848 257/347 |
| 2013/0277720 A1* | 10/2013 | Kim | H01L 29/785 257/288 |
| 2013/0330889 A1* | 12/2013 | Yin | H01L 21/823821 438/197 |

(Continued)

*Primary Examiner* — Khiem D Nguyen
*Assistant Examiner* — Pauline Vu
(74) *Attorney, Agent, or Firm* — Jianq Chyun IP Office

(57) ABSTRACT

A method for fabricating a fin field effect transistor (FinFET) comprising the following steps is provided. A substrate comprising a plurality of trenches and a plurality of semiconductor fins between the trenches is provided. A plurality of insulators are formed in the trenches. A fin cut process is performed to remove portions of the semiconductor fins until a plurality of concaves are formed between the insulators. A gate stack is formed to partially cover the semiconductor fins and the insulators.

20 Claims, 14 Drawing Sheets

(56) References Cited

U.S. PATENT DOCUMENTS

| | | | |
|---|---|---|---|
| 2014/0264488 A1* | 9/2014 | Fronheiser | H01L 29/66795 257/288 |
| 2014/0353801 A1* | 12/2014 | Jacob | H01L 21/761 257/618 |
| 2015/0008484 A1* | 1/2015 | Cea | H01L 29/66545 257/192 |
| 2015/0035046 A1* | 2/2015 | Kim | H01L 29/42392 257/327 |
| 2015/0147874 A1* | 5/2015 | Huang | H01L 21/823431 438/514 |
| 2015/0187571 A1* | 7/2015 | Fan | H01L 29/0653 257/401 |
| 2015/0214117 A1* | 7/2015 | Cheng | H01L 29/785 438/504 |
| 2015/0214341 A1* | 7/2015 | Shin | H01L 29/66818 257/401 |
| 2015/0243739 A1* | 8/2015 | Chen | H01L 29/7851 257/623 |
| 2015/0294912 A1* | 10/2015 | Xie | H01L 27/0886 438/283 |
| 2015/0325646 A1* | 11/2015 | Lai | H01L 29/7851 257/369 |
| 2015/0333156 A1* | 11/2015 | Cheng | H01L 29/785 257/623 |
| 2016/0163604 A1* | 6/2016 | Xie | H01L 21/823878 257/401 |
| 2016/0247876 A1* | 8/2016 | Chung | H01L 29/0649 |
| 2016/0284706 A1* | 9/2016 | Chung | H01L 27/0924 |
| 2016/0315080 A1* | 10/2016 | Song | H01L 29/0653 |

\* cited by examiner

FIN FIELD EFFECT TRANSISTOR AND METHOD FOR FABRICATING THE SAME

BACKGROUND

As the semiconductor devices keeps scaling down in size, three-dimensional multi-gate structures, such as the fin-type field effect transistor (FinFET), have been developed to replace planar Complementary Metal Oxide Semiconductor (CMOS) devices. A structural feature of the FinFET is the silicon-based fin that extends upright from the surface of the substrate, and the gate wrapping around the conducting channel that is formed by the semiconductor fin further provides a better electrical control over the channel.

During fabrication of FinFETs, the semiconductor fins are patterned by fin cut last process to remove unwanted portions of the semiconductor fins, and after the fin cut process, shallow trench isolations (STI) and gate stacks are then formed. During the fin cut process, a patterned photoresist layer is forming to partially cover the semiconductor fins and the unwanted portions of the semiconductor fins are etched. Since the patterned photoresist layer used in fin cut process is formed over the substrate and may not be sufficient thick to protect the semiconductor fins covered thereby, especially the semiconductor fins distributed in a dense area (e.g., core area) of an integrated circuit. Thus, fin damage occurs during the fin cut process and stability of the fin cut process deteriorates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2F' and FIG. 3F' schematically illustrate modification of FIG. 2F and FIG. 3F.

FIG. 2G' and FIG. 3G' schematically illustrate modification of FIG. 2G and FIG. 3G.

DETAILED DESCRIPTION

Figure 1:
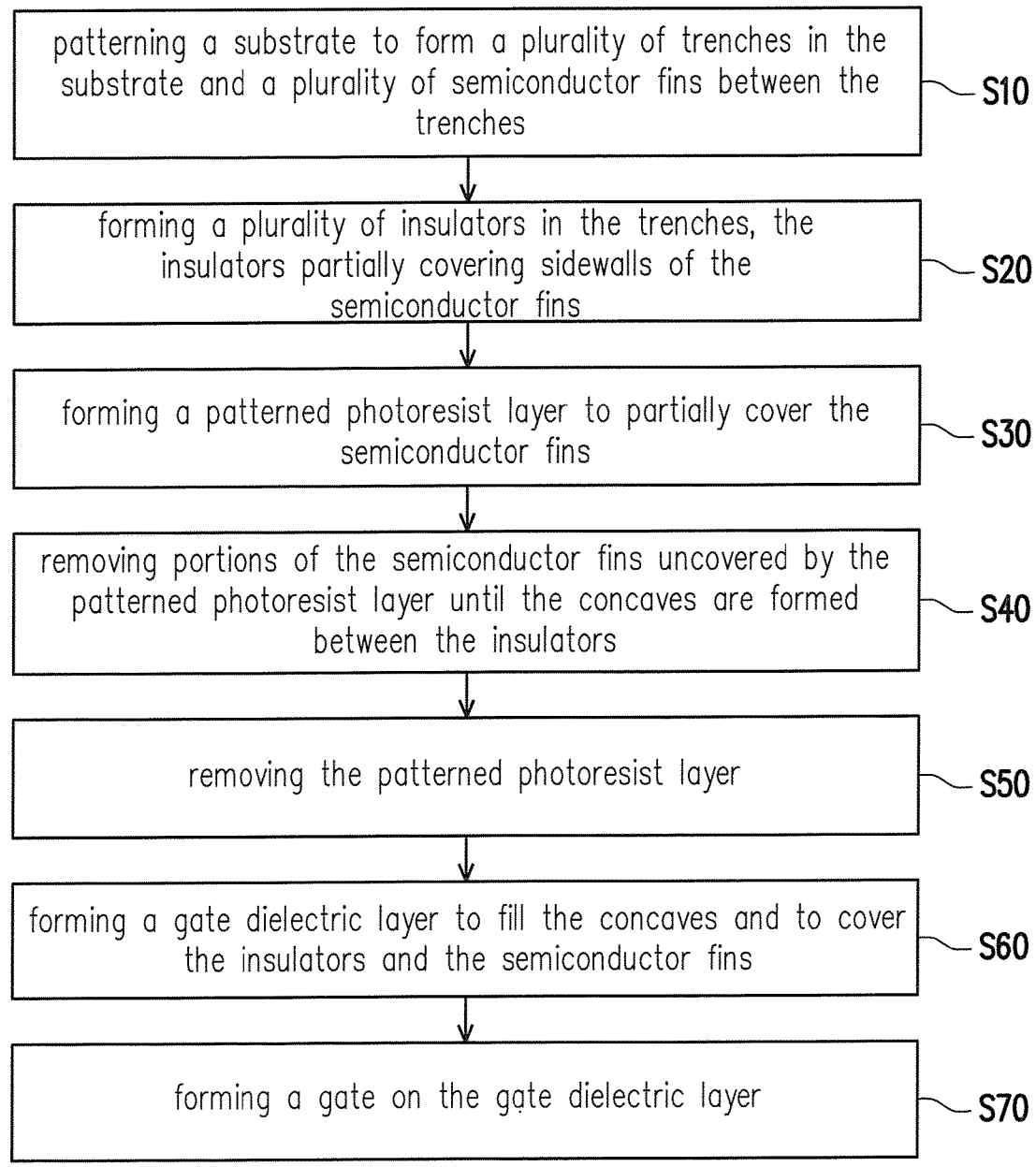
FIG. 1 illustrates a flow chart illustrating a method for fabricating a FinFET in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments of the present disclosure describe the exemplary fabricating process of FinFETs. The FinFETs may be formed on bulk silicon substrates in certain embodiments of the present disclosure. Still, the FinFET may be formed on a silicon-on-insulator (SOI) substrate or a germanium-on-insulator (GOI) substrate as alternatives. Also, in accordance with the embodiments, the silicon substrate may include other conductive layers or other semiconductor elements, such as transistors, diodes or the like. The embodiments are not limited in this context.

FIG. 1 illustrates a flow chart illustrating a method for fabricating a FinFET in accordance with some embodiments of the present disclosure. Referring to FIG. 1, the method at least includes step S10, step S20, step S30, step 40, step 50, step S60 and step S70. First, in step S10, a substrate is patterned to form a plurality of trenches in the substrate and a plurality of semiconductor fins between the trenches. Then, in step S20, a plurality of insulators are formed in the trenches, wherein the insulators partially cover sidewalls of the semiconductor fins. In step S30, a patterned photoresist layer is formed to partially cover the semiconductor fins. In step S40, portions of the semiconductor fins uncovered by the patterned photoresist layer are removed until the concaves are formed between the insulators. In step S50, the patterned photoresist layer is removed after the concaves are formed. In step S60, a gate dielectric layer is formed to fill the concaves and to cover the insulators and the semiconductor fins. Thereafter, in step S70, a gate is formed on the gate dielectric layer.

Figure 2A:
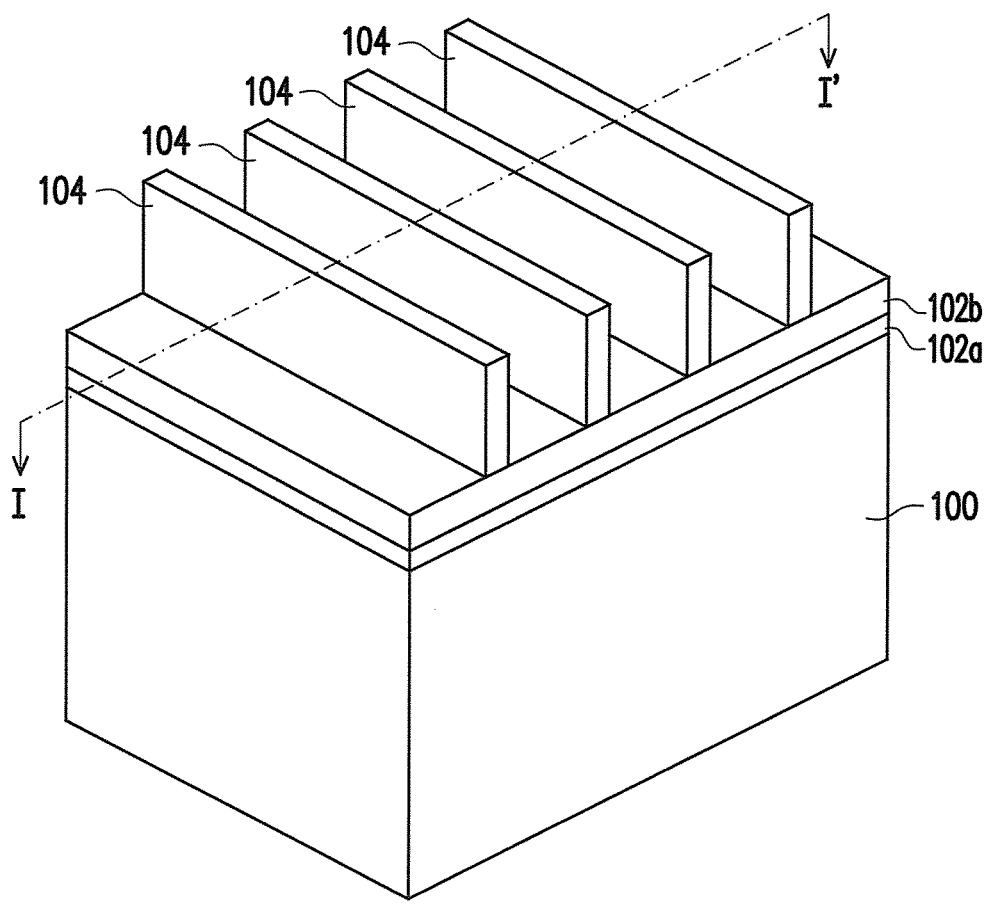
FIGS. 2A-2K are perspective views of a method for fabricating a FinFET in accordance with some embodiments of the present disclosure.
Figure 3A:
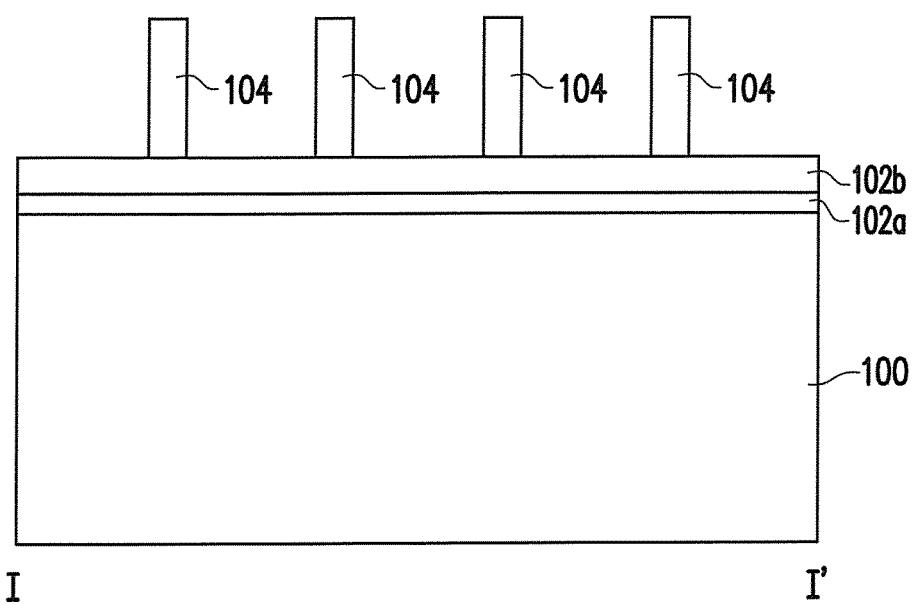
FIGS. 3A-3K are cross-sectional views of a method for fabricating a FinFET in accordance with some embodiments of the present disclosure.

FIG. 2A is a perspective view of the FinFET at one of various stages of the manufacturing method and FIG. 3A is a cross-sectional view of the FinFET taken along the cross-sectional line I-I' of FIG. 2A. In Step 10 in FIG. 1 and as shown in FIG. 2A and FIG. 3A, a substrate 100 is provided. In one embodiment, the substrate 100 comprises a crystalline silicon substrate (e.g., wafer). The substrate 100 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET. In some alternative embodiments, the substrate 100 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

In one embodiment, a protective layer 102a and a hard mask layer 102b are sequentially formed on the substrate 100. The protective layer 102a may be a silicon oxide thin film formed, for example, by thermal oxidation process. The protective layer 102a may act as an adhesion layer between the substrate 100 and hard mask layer 102b. The protective layer 102a may also act as an etch stop layer for etching the hard mask layer 102b. In at least one embodiment, the hard mask layer 102b is a silicon nitride layer formed, for example, by low-pressure chemical vapor deposition (LPCVD) or plasma enhanced chemical vapor deposition (PECVD). A patterned photoresist layer 104 having a predetermined pattern is formed on the hard mask layer 102b.

Figure 2B:
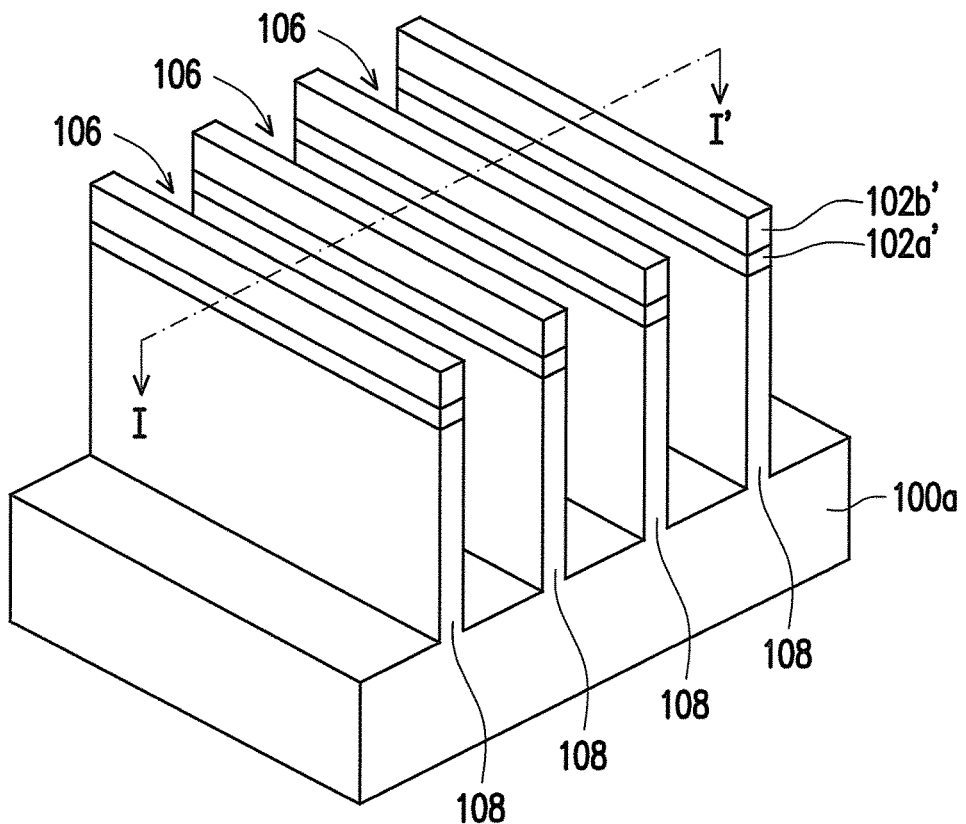
Figure 3B:
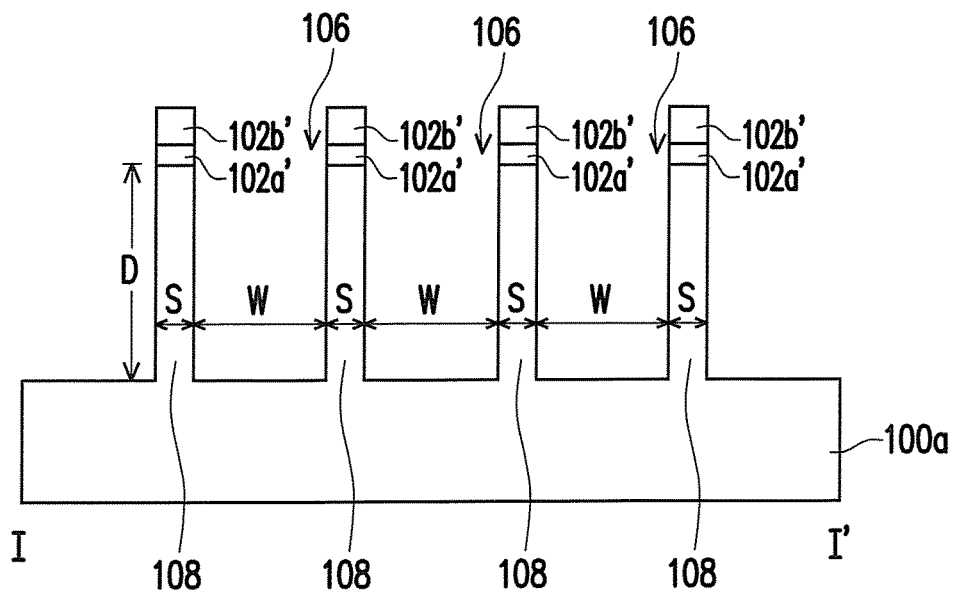
Figure 2C:
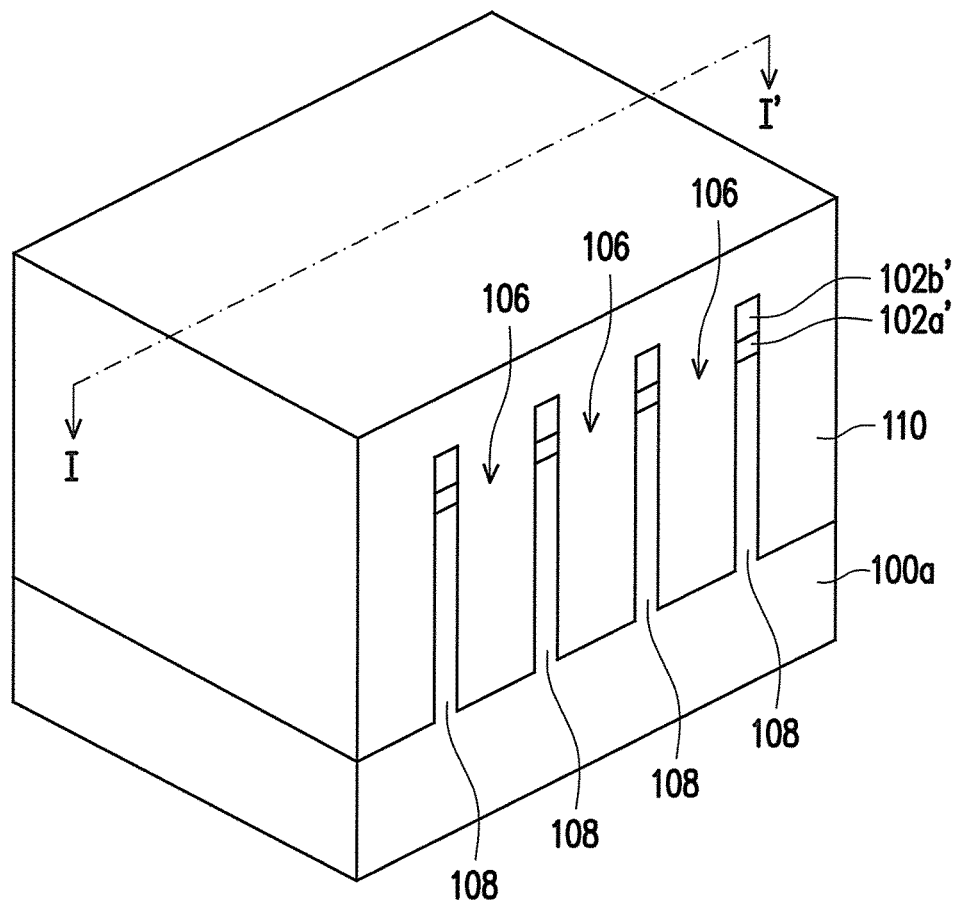
Figure 3C:
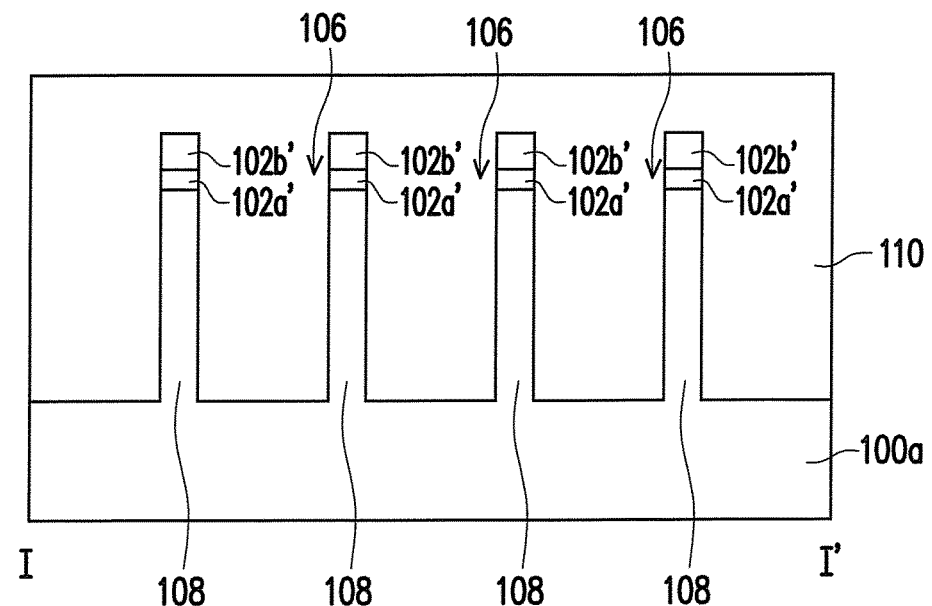

FIG. 2B is a perspective view of the FinFET at one of various stages of the manufacturing method and FIG. 3B is a cross-sectional view of the FinFET taken along the cross-sectional line I-I' of FIG. 2B. In Step S10 in FIG. 1 and as shown in FIGS. 2A-2B and FIGS. 3A-3B, the hard mask layer 102b and the protective layer 102a which are not covered by the patterned photoresist layer 104 are sequentially etched to form a patterned hard mask layer 102b' and a patterned protective layer 102a' so as to expose underlying substrate 100. By using the patterned hard mask layer 102b', the patterned protective layer 102a' and the patterned photoresist layer 104 as a mask, portions of the substrate 100 are exposed and etched to form trenches 106 and semiconductor fins 108. The semiconductor fins 108 are substantially parallel to each other, for example. The number of the semiconductor fins 108 shown in FIG. 2C and FIG. 3C is merely for illustration, in some alternative embodiments, at least one semiconductor fin (e.g., one, two, three or more than four) may be formed in accordance with actual design requirements. As shown in FIG. 2B and FIG. 3B, the semiconductor fins 108 are covered by the patterned hard mask layer 102b', the patterned protective layer 102a' and the patterned photoresist layer 104. Two adjacent trenches 106 are spaced apart by a spacing S. For example, the spacing S between two adjacent trenches 106 may be smaller than about 30 nm. In other words, two adjacent trenches 106 are spaced apart by one of the semiconductor fins 108 correspondingly and the width of the semiconductor fins 108 is the same with the spacing S.

In some embodiments, the width W of the trenches 106 ranges from about 20 nm to about 48 nm. The height of the semiconductor fins 108 and the depth D of the trenches 106 range from about 40 nm to about 70 nm, for example. After the trenches 106 and the semiconductor fins 108 are formed, the patterned photoresist layer 104 is then removed. In one embodiment, a cleaning process may be performed to remove a native oxide of the semiconductor substrate 100a and the semiconductor fins 108. The cleaning process may be performed using diluted hydrofluoric (DHF) acid or other suitable cleaning solutions.

FIG. 2C is a perspective view of the FinFET at one of various stages of the manufacturing method and FIG. 3C is a cross-sectional view of the FinFET taken along the cross-sectional line I-I' of FIG. 2C. In Step S20 in FIG. 1 and as shown in FIGS. 2B-2C and FIGS. 3B-3C, after the trenches 106 and the semiconductor fins 108 are formed, a dielectric layer 110 is then formed over the substrate 100a to fill the trenches 106 and covers the semiconductor fins 108. In addition to the semiconductor fins 108, the dielectric layer 110 further covers the patterned pad layer 102a' and the patterned hard mask layer 102b'. The dielectric layer 110 may include silicon oxide, silicon nitride, silicon oxynitride, a spin-on dielectric material, or a low-K dielectric material. The dielectric layer 110 may be formed by high-density-plasma chemical vapor deposition (HDP-CVD), sub-atmospheric CVD (SACVD) or by spin-on. In some alternative embodiments, the dielectric layer 110 is a flowable dielectric layer formed by chemical vapor deposition (CVD) process and curing process.

Figure 2D:
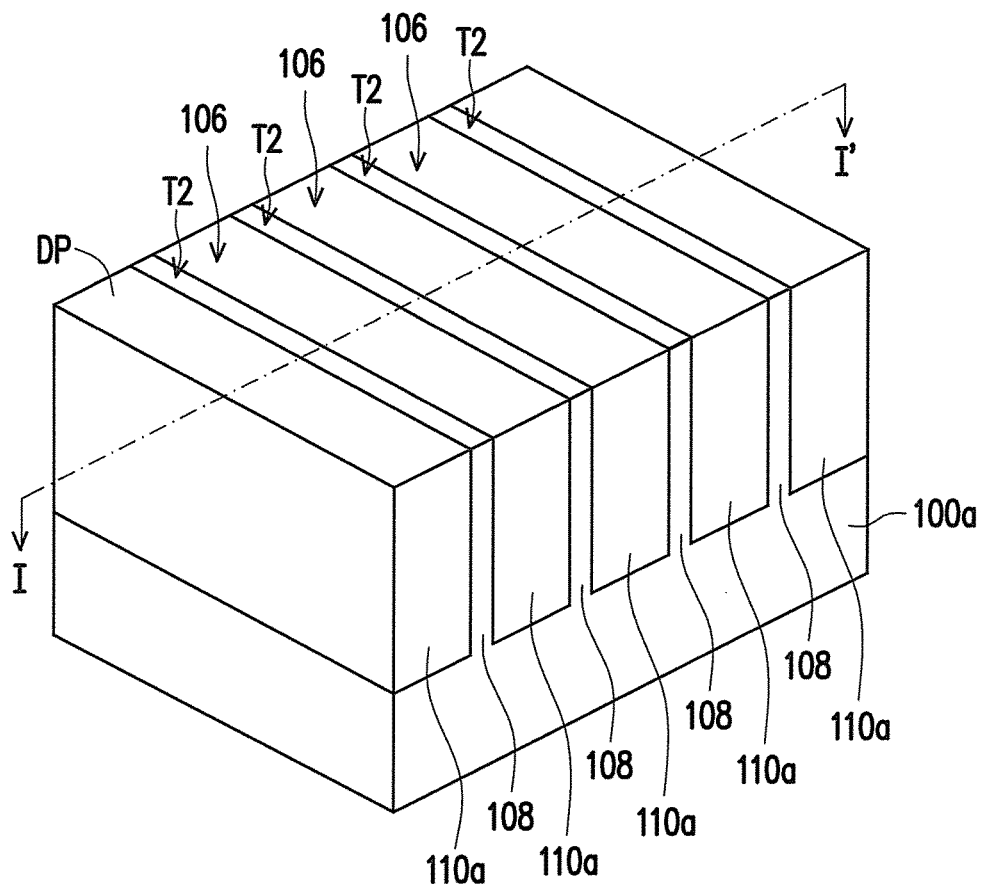
Figure 3D:
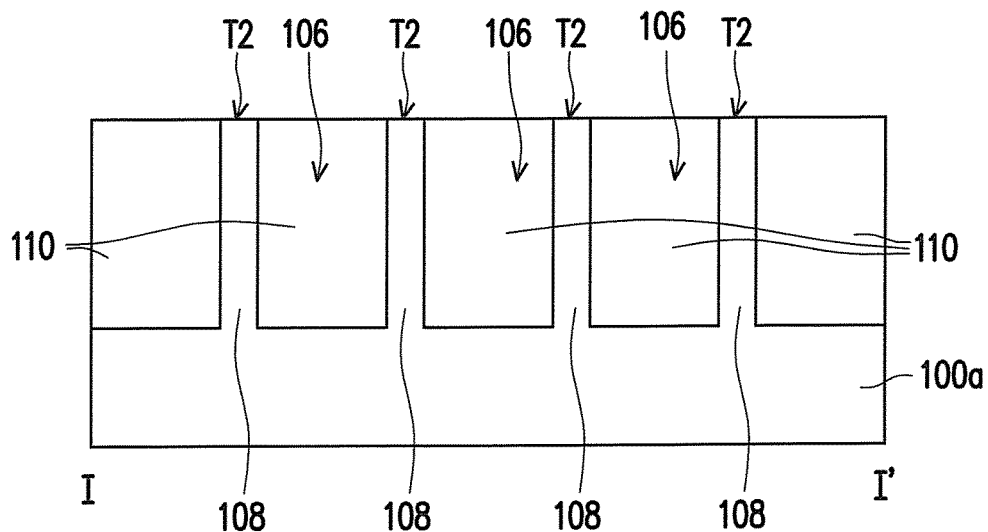

FIG. 2D is a perspective view of the FinFET at one of various stages of the manufacturing method and FIG. 3D is a cross-sectional view of the FinFET taken along the cross-sectional line I-I' of FIG. 2D. In Step S20 in FIG. 1 and as shown in FIGS. 2C-2D and FIGS. 3C-3D, a planarization process, such as chemical mechanical polish (CMP) process is, for example, performed to remove a portion of the dielectric layer 110 that is outside the trenches 106, the patterned hard mask layer 102b' and the patterned protective layer 102a' until the top surfaces T2 of the semiconductor fins 108 are exposed. As shown in FIG. 2D and FIG. 3D, after the dielectric layer 110 is polished, top surfaces of the polished dielectric layer 110 is substantially aligned or coplanar with the top surfaces T2 of the semiconductor fins 108.

Figure 2E:
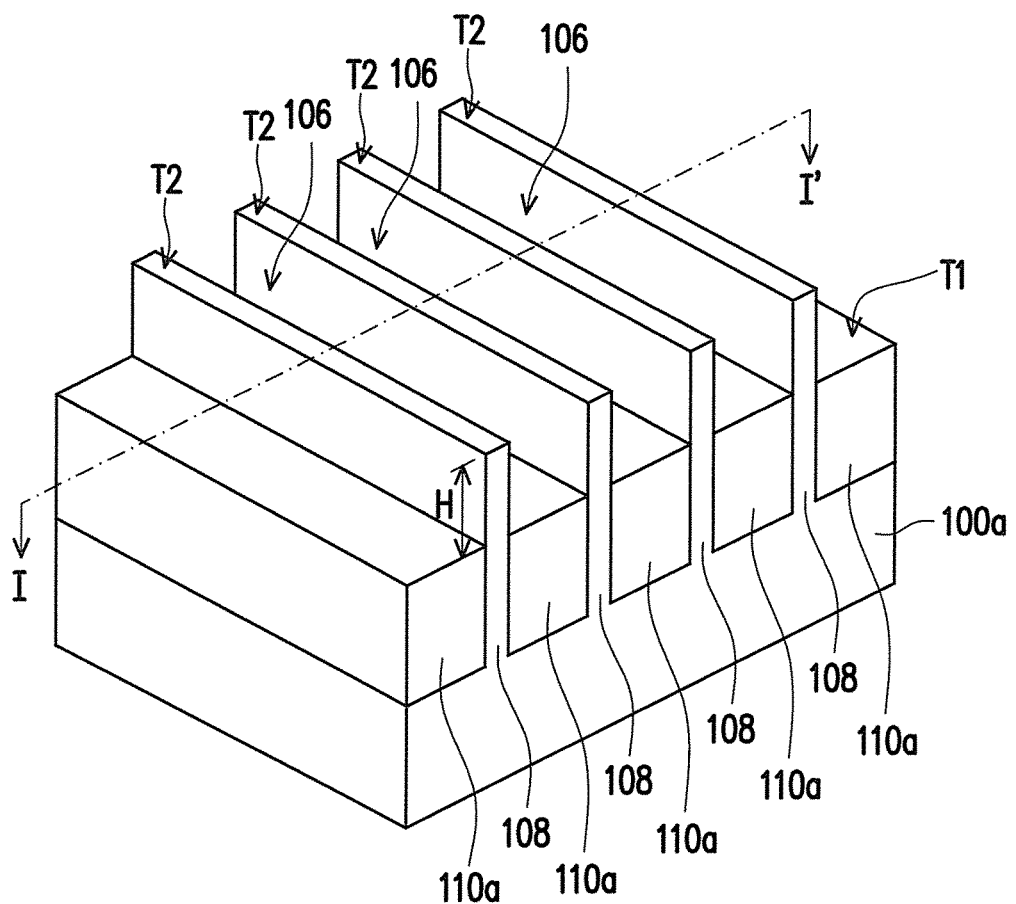
Figure 3E:
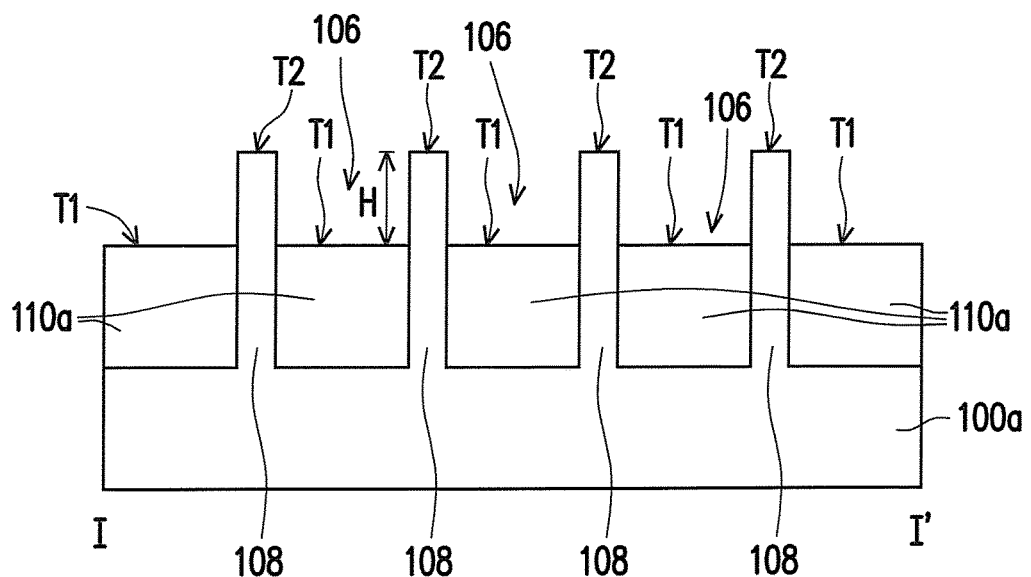

FIG. 2E is a perspective view of the FinFET at one of various stages of the manufacturing method and FIG. 3E is a cross-sectional view of the FinFET taken along the cross-sectional line I-I' of FIG. 2E. In Step S20 in FIG. 1 and as shown in FIGS. 2D-2E and FIGS. 3D-3E, after the dielectric layer 110 outside the trenches 106 is removed, the remaining dielectric layer 110 in the trenches 106 are partially removed by an etching process such that insulators 110a (e.g. STI structure) are formed in the trenches 106 and partially cover sidewalls of the semiconductor fin 108. In some embodiments, the etching process may be a wet etching process with hydrofluoric acid (HF) or a dry etching process.

As shown in FIG. 2E and FIG. 3E, the top surfaces T1 of the insulators 110a are lower than the top surfaces T2 of the semiconductor fins 108. The semiconductor fins 108 protrude from the top surfaces T1 of the insulators 110a. The height difference H (i.e. fin height) between the top surfaces T2 of the fins 108 and the top surfaces T1 of the insulators 110a ranges from about 15 nm to about 50 nm, for example.

Figure 2F:
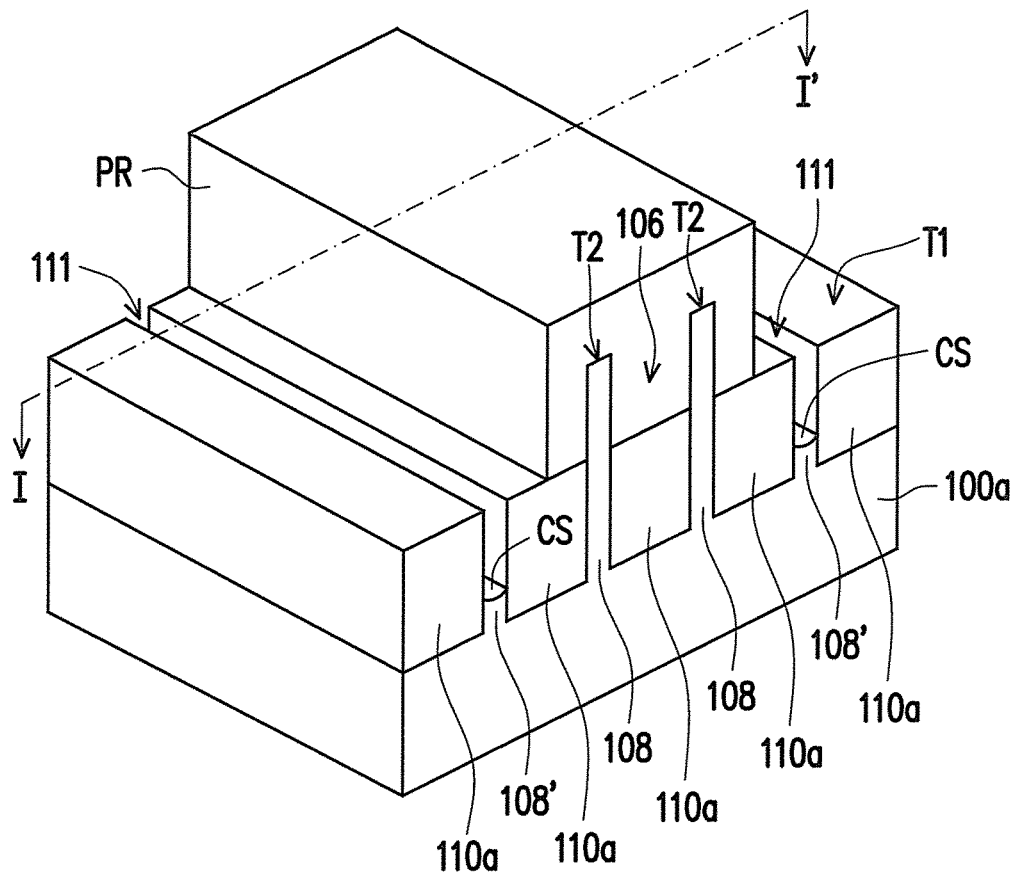
Figure 3F:
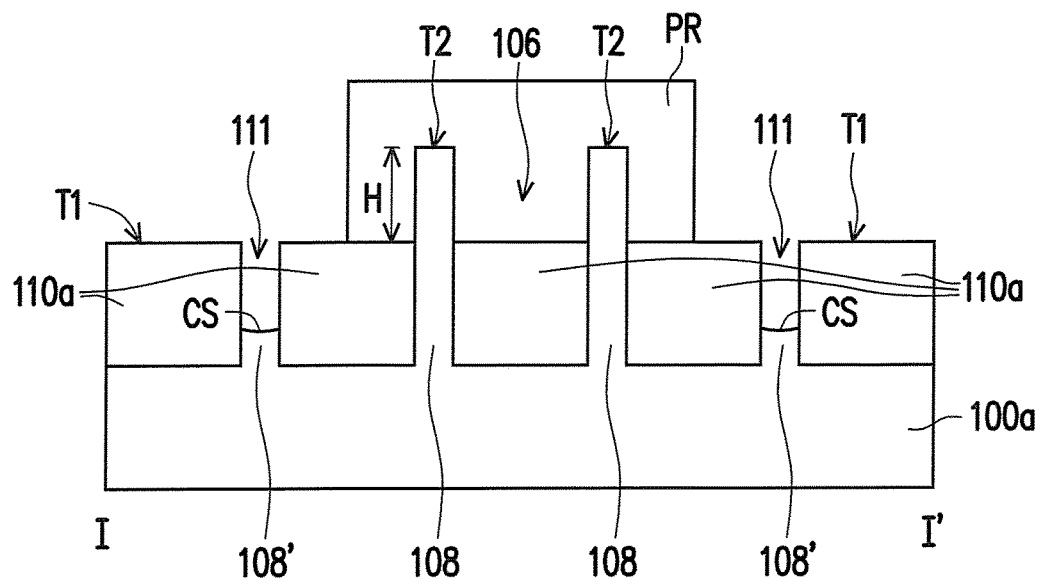
Figure 3F:
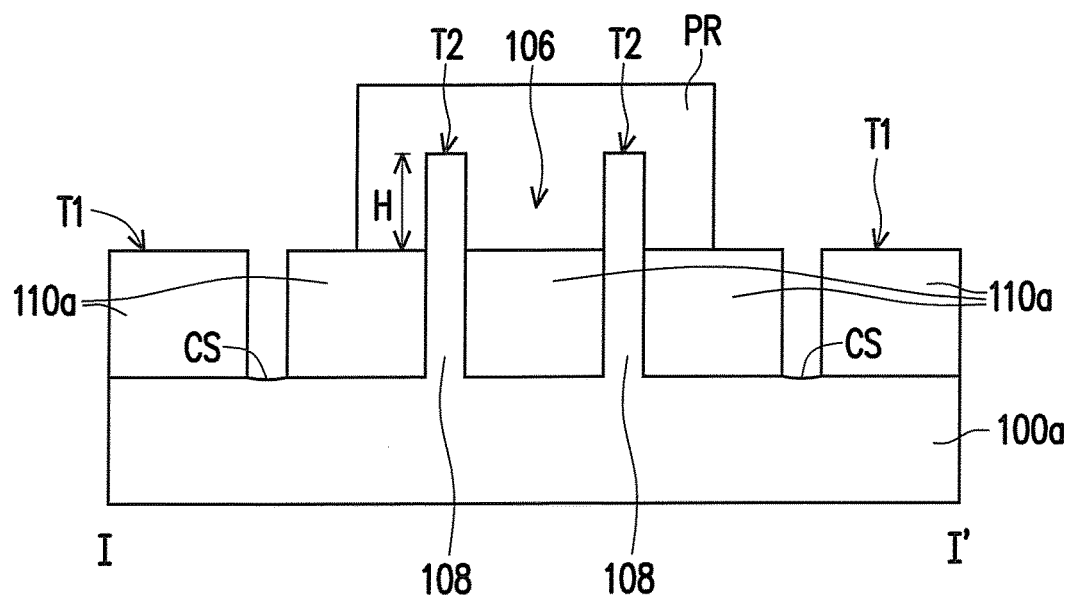

FIG. 2F is a perspective view of the FinFET at one of various stages of the manufacturing method and FIG. 3F is a cross-sectional view of the FinFET taken along the cross-sectional line I-I' of FIG. 2F. In Steps S30~S40 in FIG. 1 and as shown in FIGS. 2E-2F and FIGS. 3E-3F, a fin cut process is performed to remove unwanted portions of the semiconductor fins 108 until a plurality of concaves 111 are formed between the insulators 110a. For example, the fin cut process is performed by photolithograph and etching processes. The Details of the fin cut process is illustrated as followings.

After the semiconductor fins 108 and the insulators 110a are fabricated, a patterned photoresist layer PR is formed to partially cover the semiconductor fins 108 (Step S30). The wanted portions of the semiconductor fins 108 are covered by the patterned photoresist layer PR while the unwanted portions of the semiconductor fins 108 are not covered and are exposed by the patterned photoresist layer PR. In some embodiments, the patterned photoresist layer PR is formed on the top surfaces T1 of the insulators 110a and partially covers the wanted portions of the semiconductor fins 108. Since the patterned photoresist layer PR is formed on the top surfaces T1 of the insulators 110a, the semiconductor fins 108 distributed in dense areas (e.g., core areas) of an integrated circuit can be easily covered and protected by the patterned photoresist layer PR. In other words, upper portions of the semiconductor fins 108 are protected by the patterned photoresist layer PR while lower portions of the semiconductor fins 108 are protected by insulators 110a.

When the patterned photoresist layer PR is formed to cover the semiconductor fins 108 distributed in dense areas (e.g., core areas) of the integrated circuit, it is easy to meet the thickness requirement of the patterned photoresist layer PR because the lower portions of the semiconductor fins 108 are protected by insulators 110a.

After the patterned photoresist layer PR is formed over the insulators 110a, the unwanted portions of the semiconductor fins 108 uncovered by the patterned photoresist layer PR are removed until the concaves 111 are formed between the insulators 110a (Step S40). The removal or the unwanted portions of the semiconductor fins 108 is a self-aligned process and process window of formation of the patterned photoresist layer PR is large. In some embodiments, the unwanted portions of the semiconductor fins 108 are etched by using the patterned photoresist layer PR as an etching mask. During the removal of the unwanted portions of the semiconductor fins 108, the unwanted portions of the semiconductor fins 108 is, for example, etched by an etchant(e.g., HBr, He, $Cl_2$, $NF_3$, $O_2$, $SF_6$, $CF_4$, $CH_3F$, $CH_2F_2$, $CH_xF_y$, $N_2$, $SO_2$, Ar and so on) effectively and the etchant does not damage the insulators 110a significantly. In some embodiments, the above-mentioned etching process for removing the unwanted portions of the semiconductor fins 108 may be a wet etching process or a dry etching process.

The number of the concaves 111 is merely for illustration, in some alternative embodiments, one concave or more than two concaves may be formed in accordance with actual design requirements.

As shown in FIG. 2F and FIG. 3F, after the unwanted portions of the semiconductor fins 108 are removed, a plurality of semiconductor portions 108' remain in the concaves 111. In some embodiments, the semiconductor portions 108' may include curved surfaces CS on top thereof and the curved surfaces CS are exposed by the concaves 111. The curved surfaces CS are lower than the top surfaces T1 of the insulators 110a. For example, the semiconductor portions 108' are protrusions located at bottom of the concaves 111. Furthermore, the curved surfaces CS are sunken surfaces, for example.

In some alternative embodiments, as shown in FIG. 2F' and FIG. 3F', the unwanted portions of the semiconductor fins 108 may be removed (e.g. etched-off) until a plurality of curved surfaces CS' of the substrate 100a are formed and exposed by the concaves 111. The curved surfaces CS' are lower than the bottom surface of the insulators 110a. In other words, no semiconductor portion or protrusion remains in the concaves 111. For example, the curved surfaces CS' are sunken surfaces.

After the unwanted portions of the semiconductor fins 108 are removed, the patterned photoresist layer PR shown in FIG. 2F and FIG. 3F is removed (step S50).

FIG. 2G through FIG. 2K are perspective views of the FinFET at various stages of the manufacturing method and FIG. 3G through FIG. 3K are cross-sectional views of the FinFET taken along the cross-sectional line I-I' of FIG. 2G through FIG. 2K. In Steps S60~S70 in FIG. 1 and as shown in FIGS. 2F-2G and FIGS. 3F-3G, a gate stack GS (shown in FIG. 2K) is then formed so as to partially cover the semiconductor fins 108 and the insulators 110a. The formation of the gate stack GS (shown in FIG. 2K) is illustrated in accompany with FIG. 2G through FIG. 2K and FIG. 3G through FIG. 3K.

Figure 2F:
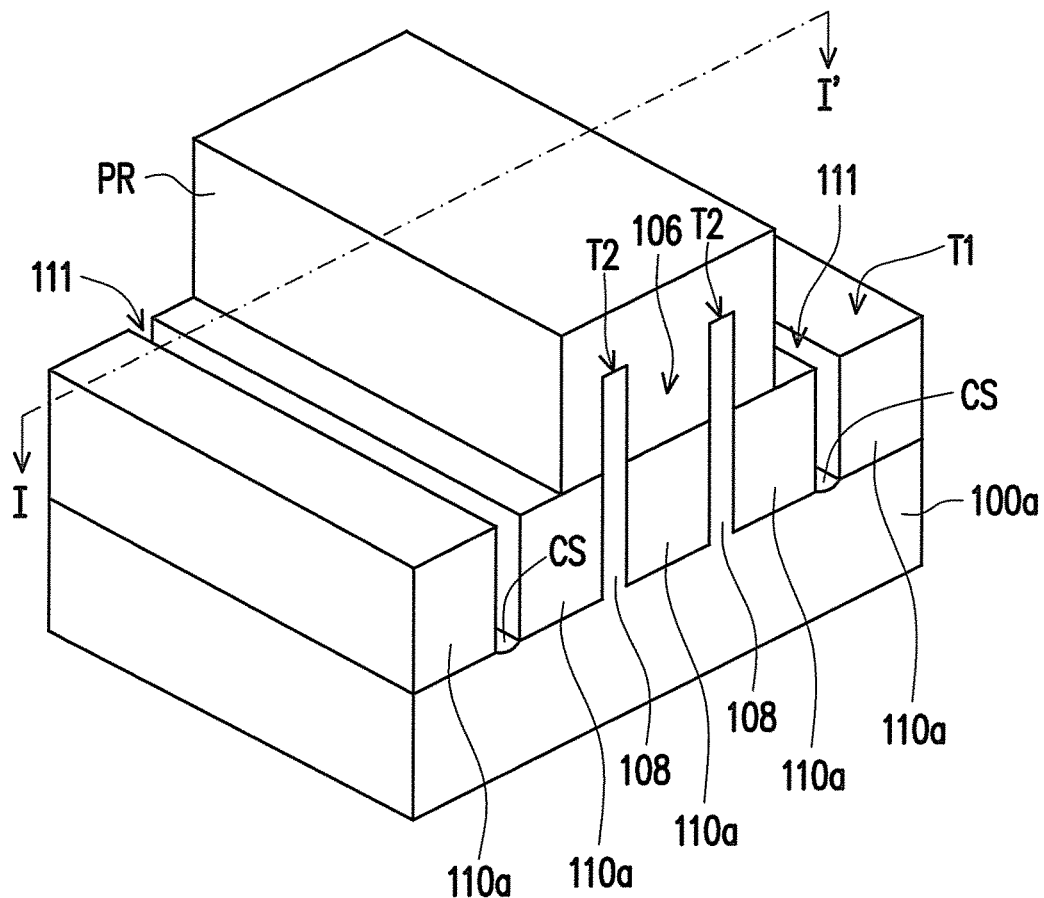
Figure 2G:
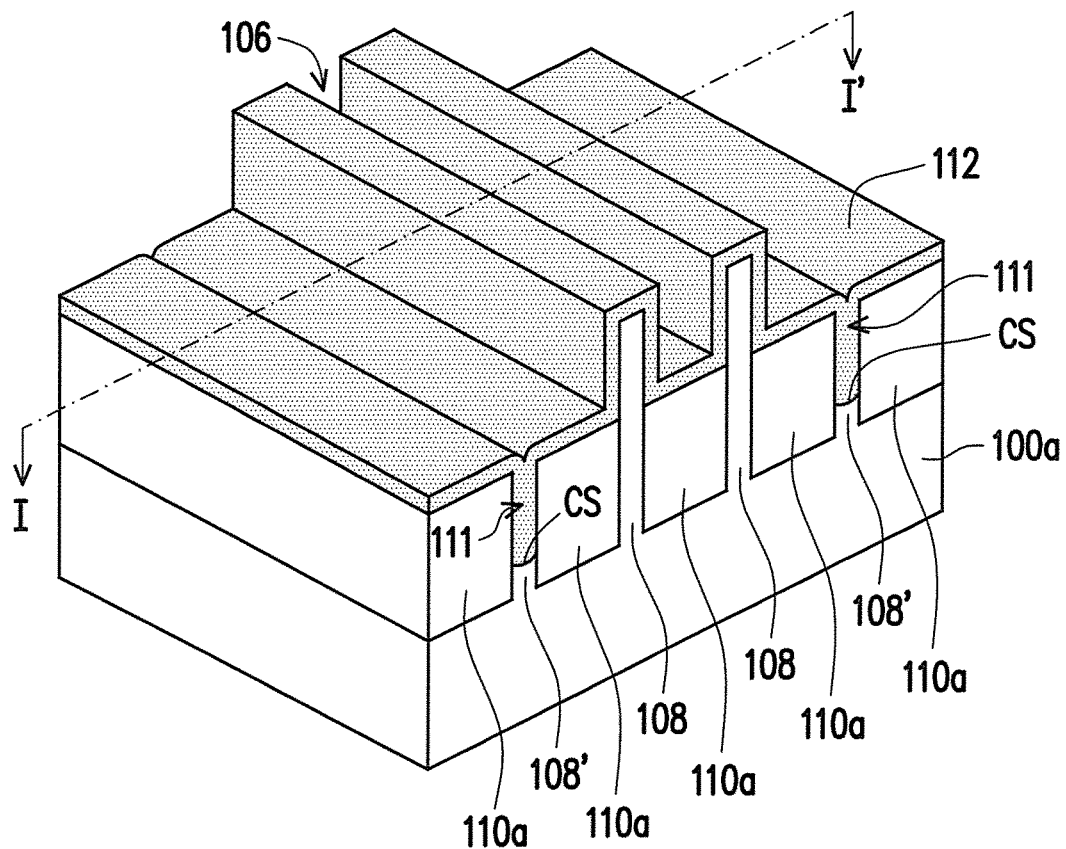
Figure 3G:
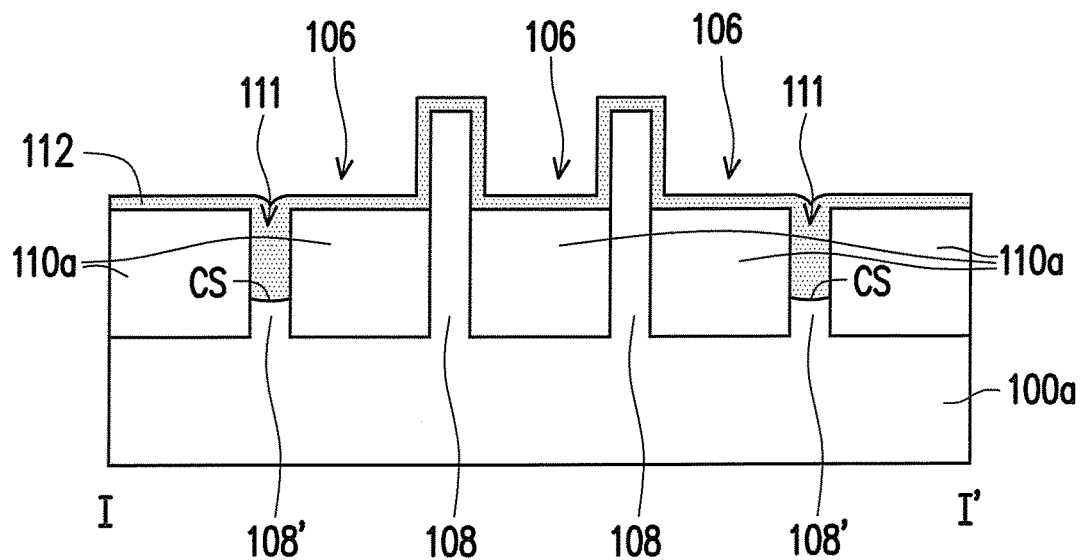
Figure 3G:
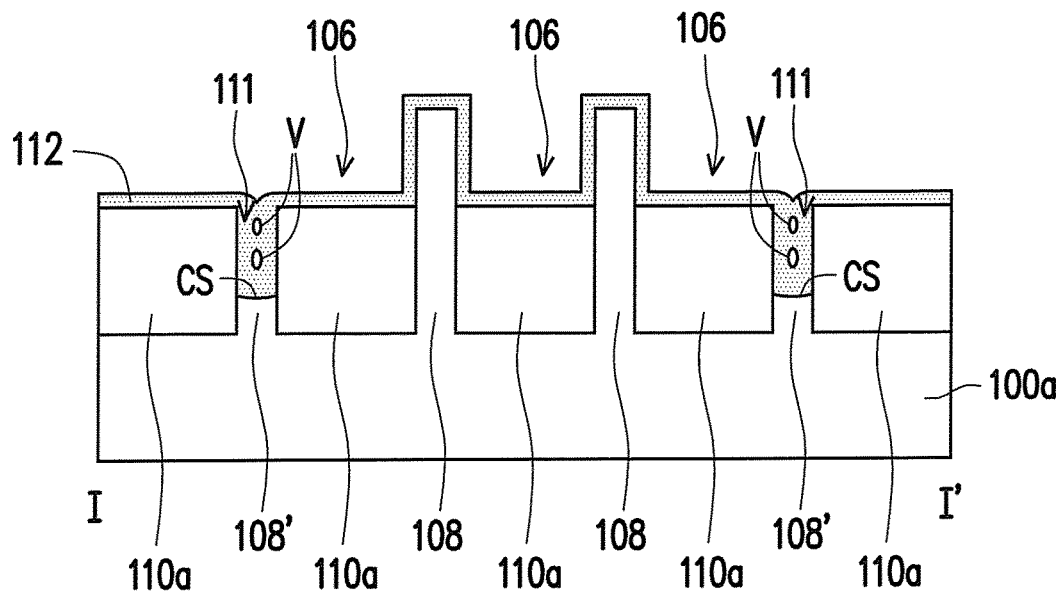

In Steps S60 in FIG. 1 and as shown in FIG. 2G and FIG. 3G, a gate dielectric layer 112 is formed to fill the concaves 111 and to cover the insulators 110a and the semiconductor fins 108. In other words, the concaves 111 between the insulators 110a are filled by the gate dielectric layer 112 and the semiconductor portion 108'. The gate dielectric layer 112 filled between the insulators 110a provides good insulation characteristics and structural strength. In some embodiments, the thickness of the gate dielectric layer 112 is in the range of about 1 nm to about 50 nm. The gate dielectric layer 112 may include silicon oxide, silicon nitride, silicon oxynitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. The gate dielectric layer 112 may be formed by a suitable process such as atomic layer deposition (ALD), chemical vapor deposition (CVD), physical vapor deposition (PVD), thermal oxidation, UV-ozone oxidation, or the like.

In some embodiments, the concaves 111 between the insulators 110a may be filled by the gate dielectric layer 112 and the semiconductor portion 108' entirely. In other words, the gate dielectric layer 112 includes few void distributed in the concaves 111. In some alternative embodiments, as shown in FIG. 2G' and FIG. 3G', the gate dielectric layer 112 may include voids V distributed in the concaves 111. It is noted that the voids V in the gate dielectric layer 112 may enhance insulation characteristics of the gate dielectric layer 112 and provide sufficient structural strength.

Figure 2G:
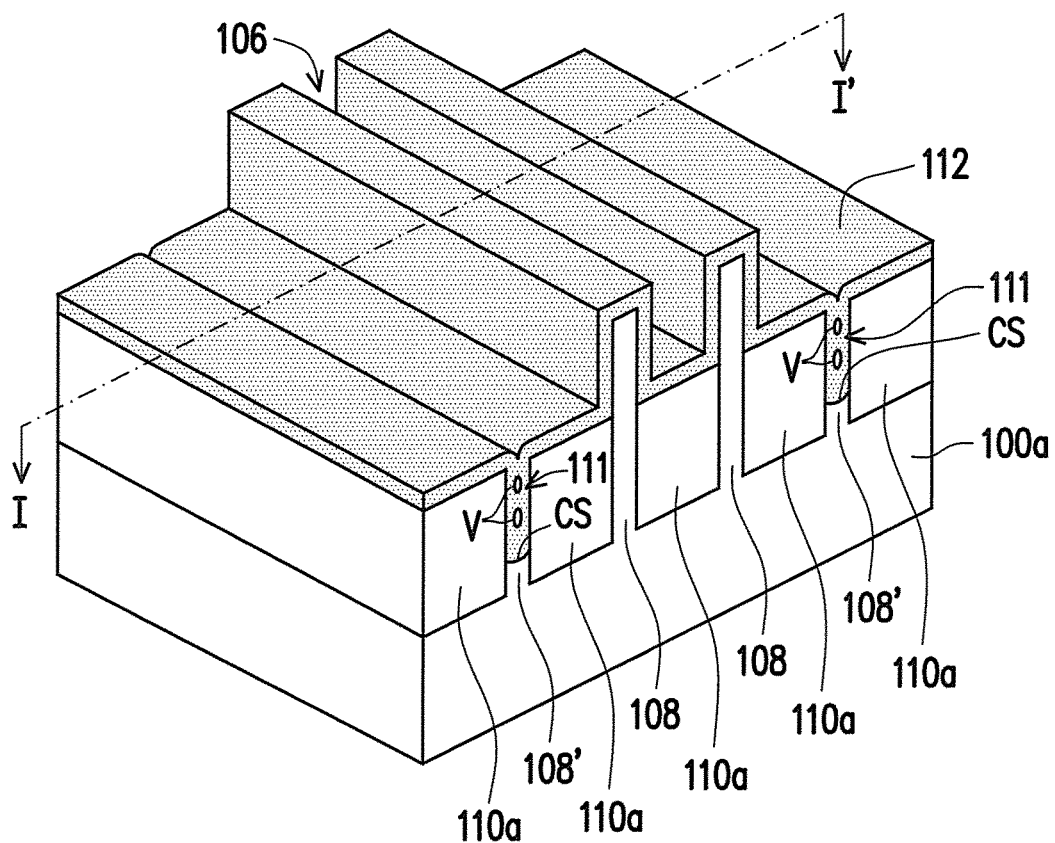
Figure 2H:
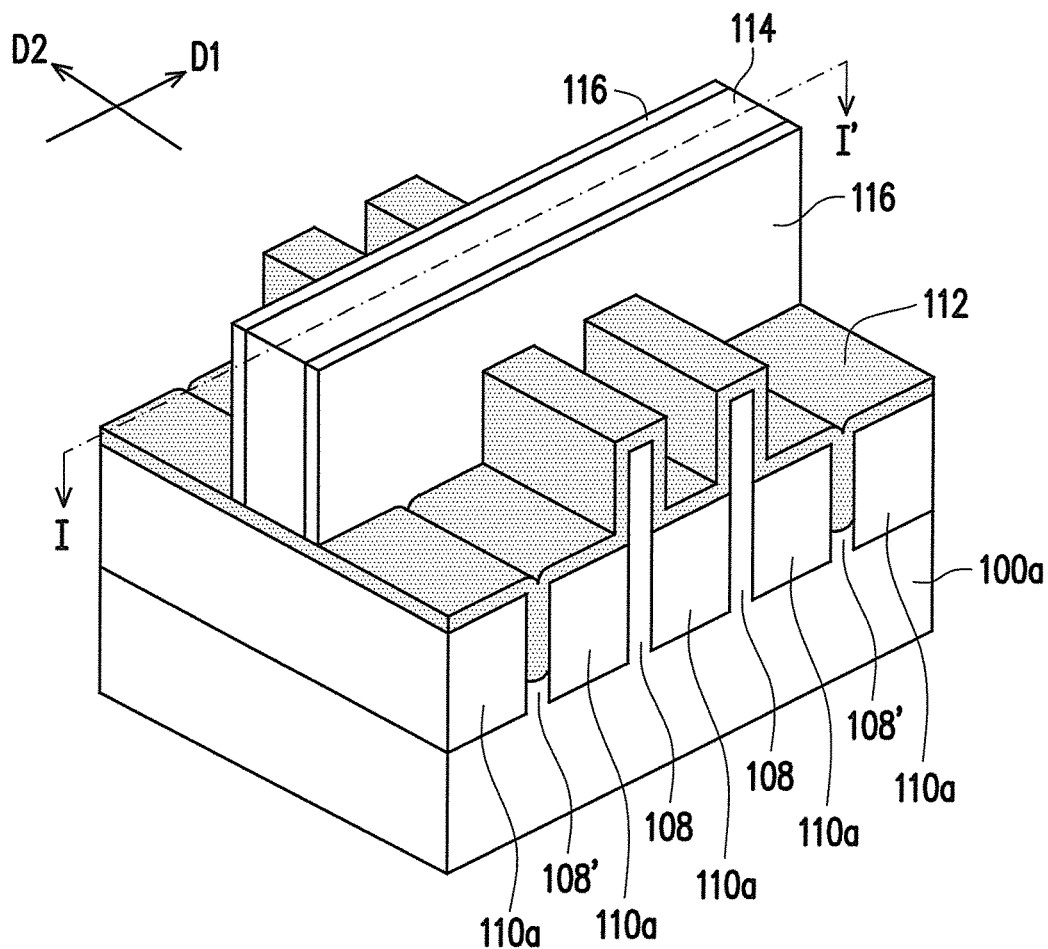
Figure 3H:
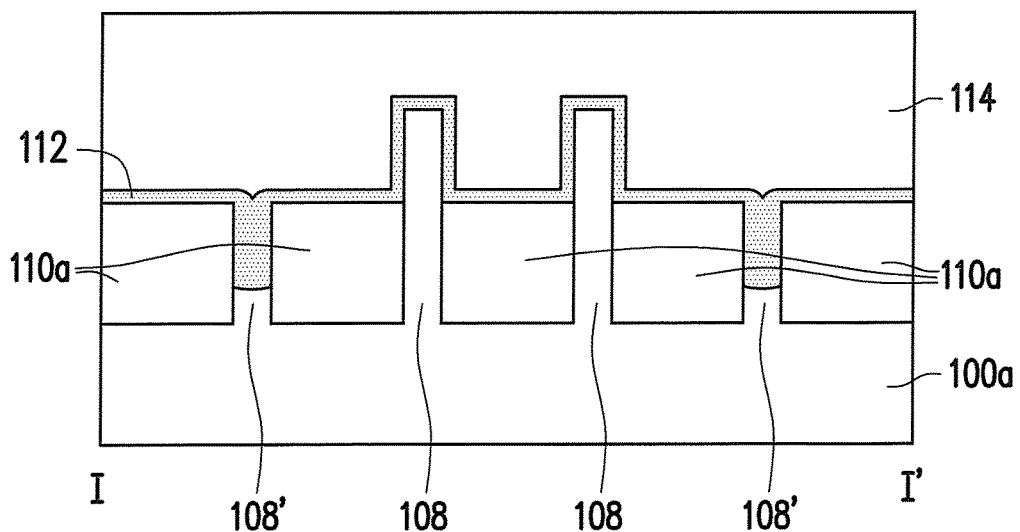

FIG. 2H is a perspective view of the FinFET at one of various stages of the manufacturing method, and FIG. 3H is a cross-sectional view of the FinFET taken along the cross-sectional line I-I' of FIG. 2H. In Step S70 in FIG. 1 and as shown in FIGS. 2G-2H and FIGS. 3G-3H, at least one dummy gate strip 114 is formed on the gate dielectric layer 112, wherein a lengthwise direction D1 of the dummy gate strip 114 is different from the lengthwise direction D2 of the semiconductor fins 108. In some embodiments, the lengthwise direction D1 of the dummy gate strip 114 is perpendicular to the lengthwise direction D2 of the semiconductor fins 108. The number of the dummy gate strip 114 shown in FIG. 2H is merely for illustration, in some alternative embodiments, two or more parallel dummy gate strips may be formed in accordance with actual design requirements. The dummy gate strip 114 includes silicon-containing material, such as poly-silicon, amorphous silicon or a combination thereof.

As shown in FIG. 2H, after the dummy gate strip 114 is formed, a pair of spacers 116 are formed on sidewalls of the dummy gate strip 114. The pair of spacers 116 are formed on the gate dielectric layer 112 and extend along the sidewalls of the dummy gate strip 114. In other words, the pair of spacers 116 extend along the lengthwise direction D1. The pair of spacers 116 are formed of dielectric materials, such as silicon nitride or SiCON. The pair of spacers 116 may include a single layer or multilayer structure.

Figure 2I:
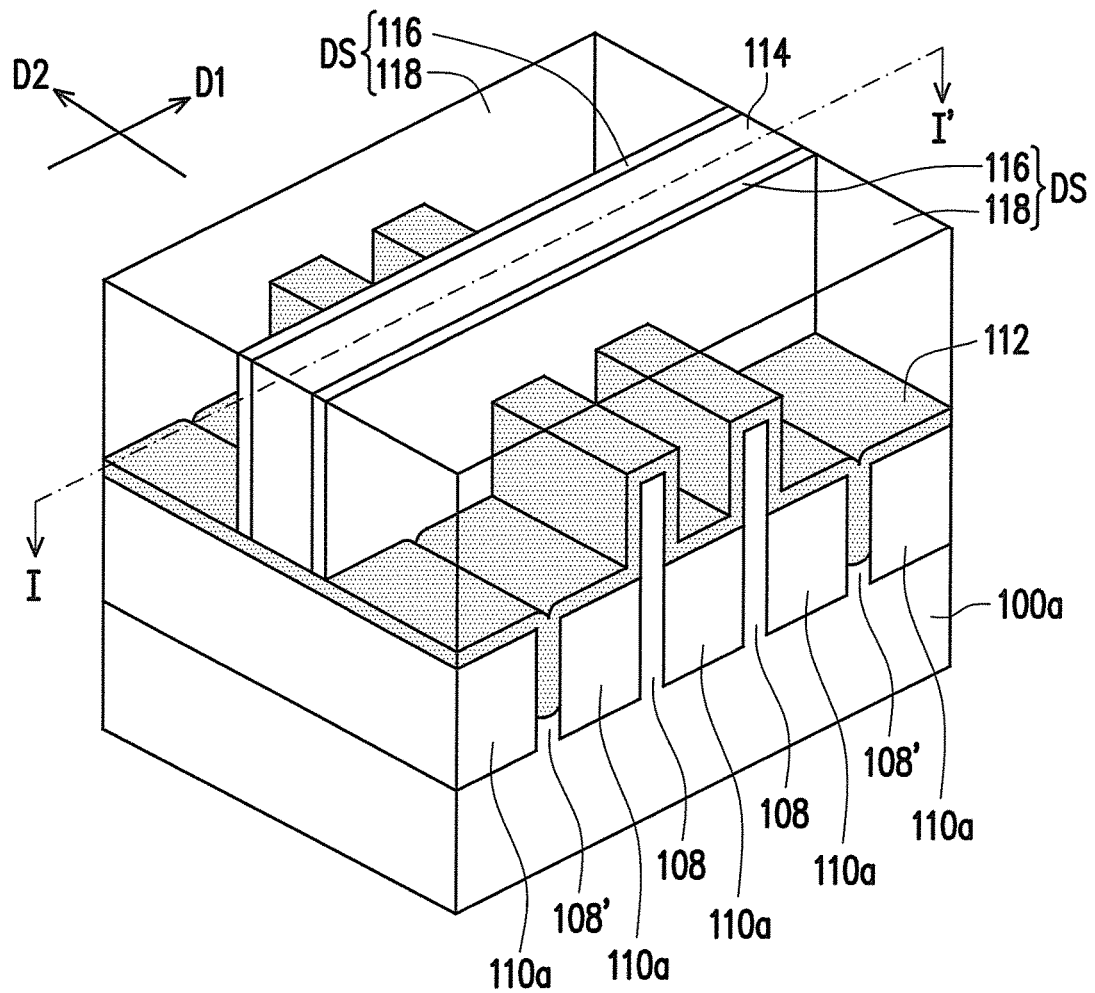
Figure 3I:
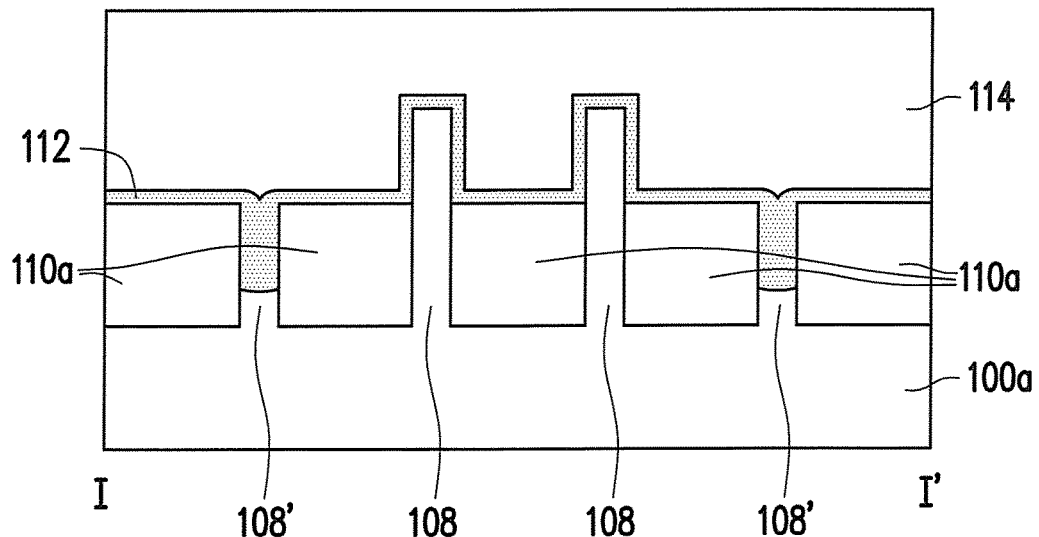

FIG. 2I is a perspective view of the FinFET at one of various stages of the manufacturing method, and FIG. 3I is a cross-sectional view of the FinFET taken along the cross-sectional line I-I' of FIG. 2I. In Step S70 in FIG. 1 and as shown in FIGS. 2H-2I and FIGS. 3H-3I, a patterned dielectric layer 118 is formed to cover the gate dielectric layer 112 that are not covered by the dummy gate strip 114 and the spacers 116. A top surface of the patterned dielectric layer 118 is substantially coplanar with the top surface of the dummy gate strip 114, for example. In some embodiments, before the patterned dielectric layer 118 is formed, some processes (e.g., patterning process of gate dielectric layer 112, semiconductor fin 108 recessing process, strained source/drain epitaxial process on the semiconductor fin 108, silicidation process and so on) may be performed in advance. Details of the aforesaid optional processes are omitted.

As shown in FIG. 2I, the combination of the pair of spacers 116 and the patterned dielectric layer 118 may be considered as a dielectric structure DS adjacent to the dummy gate strip 114. In other words, the dummy gate strip 114 may be embedded in the dielectric structure DS and the dielectric structure DS partially covers the semiconductor fins 108 and the insulators 110a.

Figure 2J:
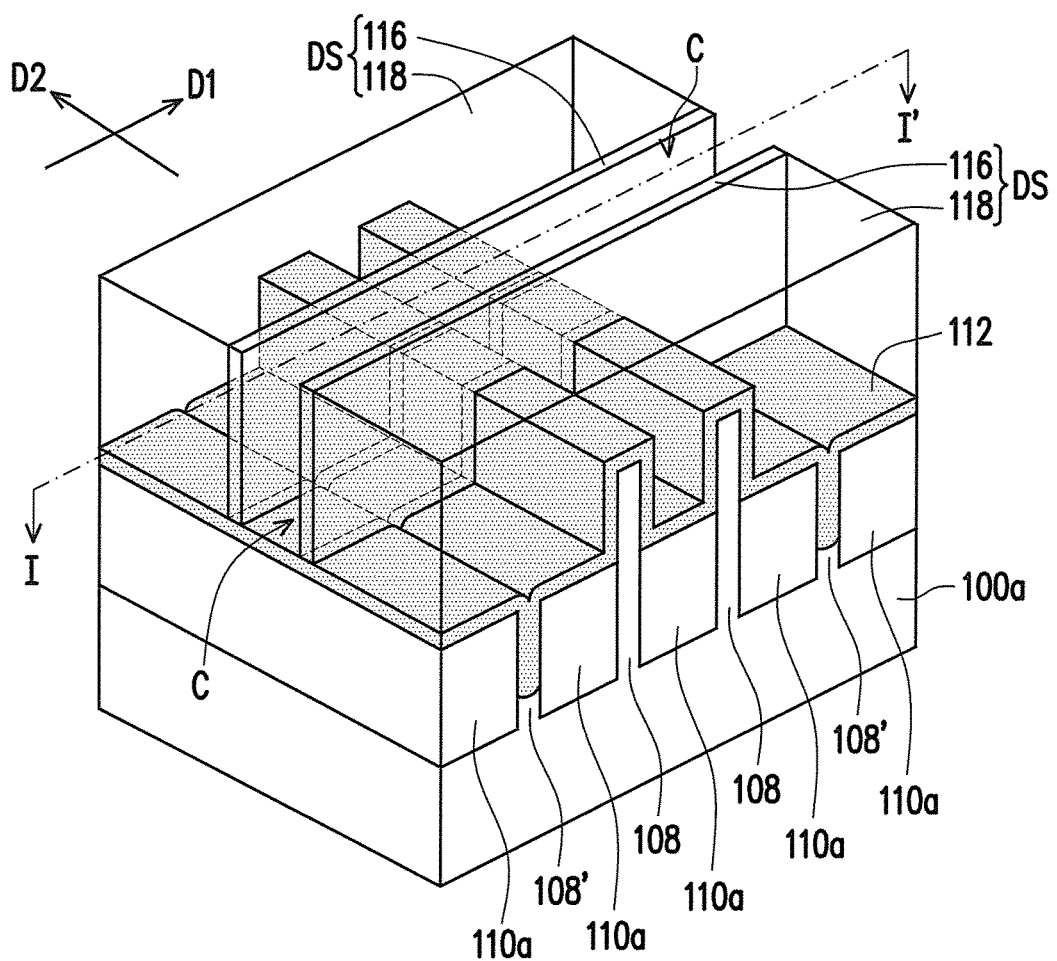
Figure 3J:
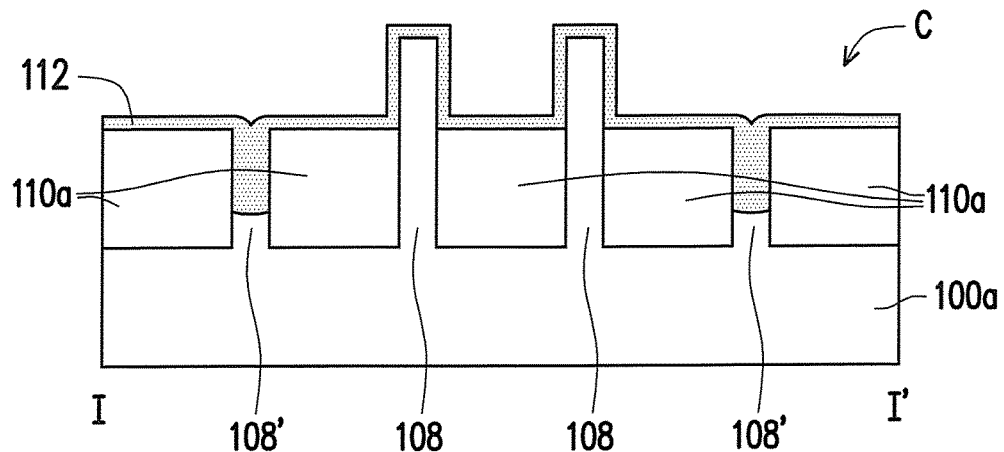

FIG. 2J is a perspective view of the FinFET at one of various stages of the manufacturing method, and FIG. 3J is a cross-sectional view of the FinFET taken along the cross-sectional line I-I' of FIG. 2J. In Step S70 in FIG. 1 and as shown in FIGS. 2I-2J and FIGS. 3I-3J, the dummy gate strip 114 is removed. In some embodiments, the dummy gate strip 114 is removed, for example, by an etching process. Through properly selecting of etchant, the dummy gate strip 114 is removed without damaging the patterned dielectric layers 118, the gate dielectric layer 112 and the spacers 116 significantly. After the dummy gate strip 114 is removed, a cavity C between the pair of spacers 116 is formed. In other words, the dielectric gate layer 112 is partially exposed by the cavity C.

Figure 2K:
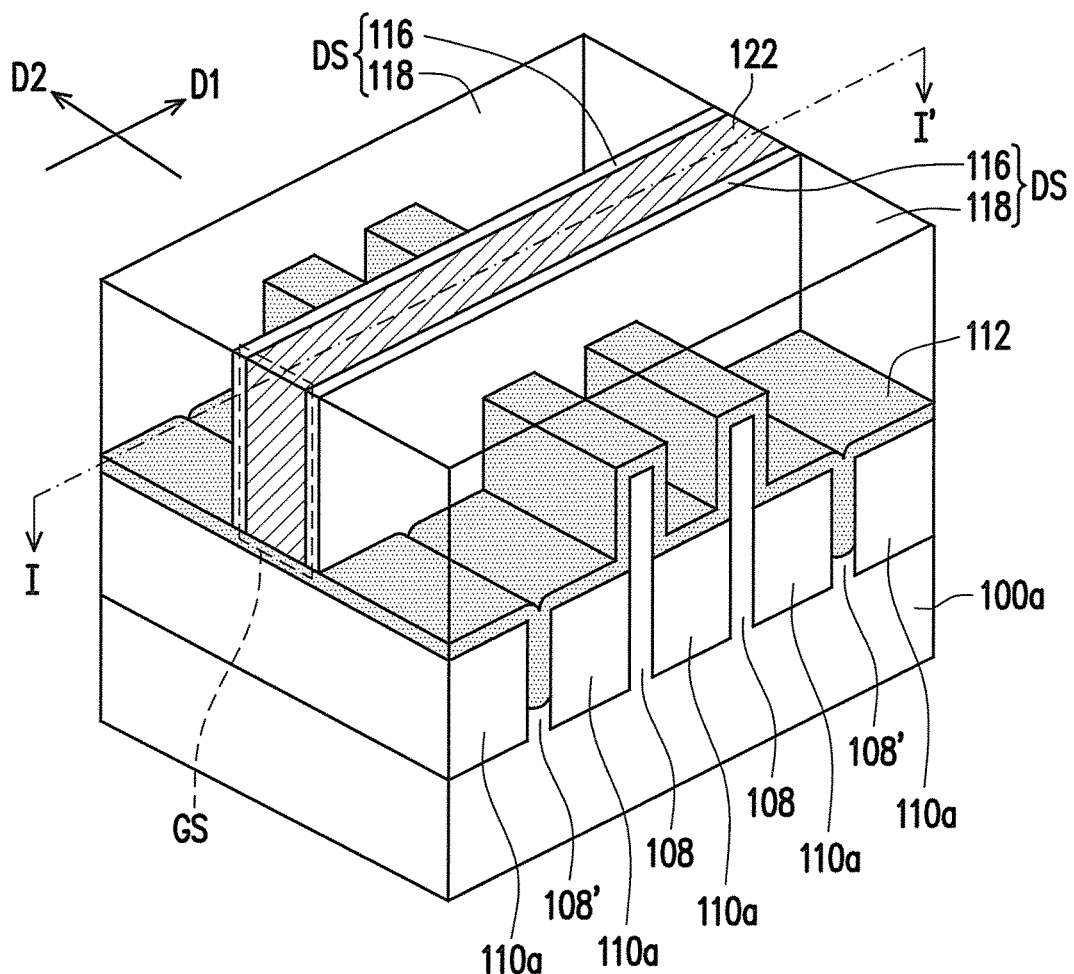
Figure 3K:
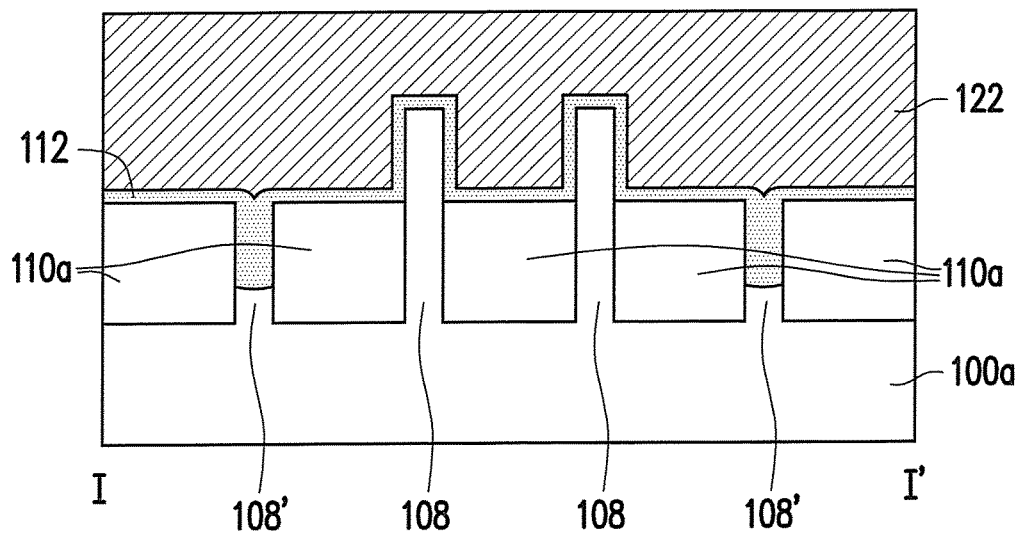

FIG. 2K is a perspective view of the FinFET at one of various stages of the manufacturing method, and FIG. 3K is a cross-sectional view of the FinFET taken along the cross-sectional line I-I' of FIG. 2K. In Step S70 in FIG. 1 and as shown in FIGS. 2J-2K and FIGS. 3J-3K, after the cavity C is formed, a gate 122 is formed in and fills the cavity C and the gate 122 covers the gate dielectric layer 112 exposed by the cavity C. The width of the gate 122 is substantially identical with the width of the dummy gate strip 114 (as shown in FIG. 2I). The channel length of the FinFET is relevant to or is determined by the width of the gate 122. In other words, the portion of the semiconductor fins 108 that is overlapped with and covered by the gate 122 serves as channels of the FinFET.

As shown in FIG. 2K, in one embodiment, the gate 122 and the gate dielectric layer 112 underneath are considered as a gate stack GS, the dielectric structure DS (e.g., the pair of spacers 116 or the combination of the pair of spacers 116 and the patterned dielectric layer 118) is formed on sidewalls of the gate stack GS, and the top surface of the dielectric structure DS is substantially coplanar with a top surface of the gate stack GS, for example. In some alternative embodiments, the above-illustrated gate replacement process (FIG. 2J through FIG. 2K and FIG. 3J through FIG. 3K) may be omitted.

In embodiments of the disclosure, since the fin cut process is performed after the insulators are formed, the remaining semiconductor fins can be protected properly. Accordingly, performance (e.g., leakage, Cp yield and so on), reliability and process control (e.g., process window) of FinFETs may be enhanced.

In accordance with some embodiments of the present disclosure, a method for fabricating a fin field effect transistor (FinFET) comprising the following steps is provided. A substrate comprising a plurality of trenches and a plurality of semiconductor fins between the trenches is provided. A plurality of insulators are formed in the trenches. A fin cut process is performed to remove portions of the semiconductor fins until a plurality of concaves are formed between the insulators. A gate stack is formed to partially cover the semiconductor fins and the insulators.

In accordance with alternative embodiments of the present disclosure, a method for fabricating a fin field effect transistor (FinFET) comprising the following steps is provided. A substrate is patterned to form a plurality of trenches in the substrate and a plurality of semiconductor fins between the trenches. A plurality of insulators are formed in the trenches, wherein the insulators partially cover sidewalls of the semiconductor fins. A patterned photoresist layer is formed to partially cover the semiconductor fins. Portions of the semiconductor fins uncovered by the patterned photoresist layer are removed until the concaves are formed between the insulators. The patterned photoresist layer is removed after the concaves are formed. A gate dielectric layer is formed to fill the concaves and to cover the insulators and the semiconductor fins. A gate is formed on the gate dielectric layer.

In accordance with yet alternative embodiments of the present disclosure, a fin field effect transistor (FinFET) comprising a substrate, a plurality of insulators, a gate dielectric layer and a gate is provided. The substrate comprises a plurality of trenches and at least one semiconductor fin between the trenches. The insulators are disposed in the trenches and at least two of the insulators are spaced apart by at least one concave therebetween. The at least one concave is filled by the gate dielectric layer, and the gate dielectric layer covers the insulators and the at least one semiconductor fin. The gate is disposed on the gate dielectric layer, and the gate partially covers the at least one semiconductor fin and the insulators.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a fin field effect transistor (FinFET), comprising:
   providing a substrate comprising trenches and semiconductor fins between the trenches;
   forming insulators in the trenches;
   performing a fin cut process to remove portions of the semiconductor fins until concaves are formed between the insulators;
   forming a gate dielectric layer to fill the concaves and to cover the insulators and the semiconductor fins; and
   forming a gate on the gate dielectric layer, wherein the gate does not extend into the concaves.

2. The method of claim 1, wherein a method of forming the insulators comprises:
   forming a dielectric layer to fill the trenches and cover the semiconductor fins;
   removing the dielectric layer outside the trenches; and
   partially removing the dielectric layer in the trenches to form the insulators.

3. The method of claim 1, wherein the fin cut process comprises:
   forming a patterned photoresist layer to partially cover the semiconductor fins;
   removing the portions of the semiconductor fins uncovered by the patterned photoresist layer until the concaves are formed between the insulators; and removing the patterned photoresist layer after the concaves are formed.

4. The method of claim 1, wherein curved surfaces of the substrate are formed and exposed by the concaves after the fin cut process is performed.

5. The method of claim 1, wherein the portions of the semiconductor fins are removed to form semiconductor portions between the insulators.

6. The method of claim 1, wherein a bottom surface of the gate is higher than a top surface of the insulators.

7. The method of claim 1, wherein curved surfaces of the substrate are formed and exposed by the concaves after the fin cut process is performed, and the curved surfaces exposed by the concaves are covered by the gate dielectric layer.

8. The method of claim 1, wherein the portions of the semiconductor fins are removed to form semiconductor portions exposed by the concaves, and the semiconductor portions exposed by the concaves are covered by the gate dielectric layer.

9. The method of claim 1, wherein the gate dielectric layer comprises voids distributed in the concaves.

10. A method for fabricating a fin field effect transistor (FinFET), comprising:
    patterning a substrate to form trenches in the substrate and semiconductor fins between the trenches;
    forming insulators in the trenches, the insulators partially covering sidewalls of the semiconductor fins;
    forming a patterned photoresist layer to partially cover the semiconductor fins;
    removing portions of the semiconductor fins uncovered by the patterned photoresist layer until concaves are forced between the insulators;
    removing the patterned photoresist layer after the concaves are formed;
    forming a gate dielectric layer to fill the concaves and to cover the insulators and the semiconductor fins;
    forming a dummy gate strip on the gate dielectric layer and forming a pair of spacers on sidewalls of the dummy gate strip, the dummy gate strip being formed over the concaves; and
    removing the dummy gate strip and forming a gate after the dummy gate strip is removed.

11. The method of claim 10, wherein a method of forming the insulators comprises:
    forming a dielectric layer to fill the trenches and cover the semiconductor fins;
    removing the dielectric layer outside the trenches; and
    partially removing the dielectric layer in the trenches to form the insulators.

12. The method of claim 10, wherein curved surfaces of the substrate are exposed by the concaves between the insulators after the portions of the semiconductor fins uncovered by the patterned photoresist layer are removed, and the curved surfaces exposed by the concaves are covered by the gate dielectric layer.

13. The method of claim 10, wherein the portions of the semiconductor fins uncovered by the patterned photoresist layer are removed to form semiconductor portions exposed by the concaves, and the semiconductor portions exposed by the concaves are covered by the gate dielectric layer.

14. The method of claim 10, wherein the gate dielectric layer comprises voids distributed in the concaves.

15. A fin field effect transistor (FinFET), comprising:
    a substrate comprising trenches and at least one semiconductor fin between the trenches;
    insulators in the trenches, at least two of the insulators being spaced apart by at least one concave therebetween;
    a gate dielectric layer, the at least one concave being filled by the gate dielectric layer, and the gate dielectric layer covering the insulators and the at least one semiconductor fin; and
    a gate disposed on the gate dielectric layer, the gate partially covering the at least one semiconductor fin and the insulators, wherein the gate does not extend into the at least one concave.

16. The FinFET of claim 15, wherein a width of the at least one concave equals to a width of the at least one semiconductor fin.

17. The FinFET of claim 15, wherein at least one curved surface of the substrate is exposed by the at least one concave and is covered by the gate dielectric layer.

18. The FinFET of claim 15, wherein the substrate comprises at least one semiconductor portion located in the at least one concave and the at least one semiconductor portion is covered by the gate dielectric layer.

19. The FinFET of claim 18, wherein the at least one concave is filled by the gate dielectric layer and the at least one semiconductor portion.

20. The FinFET of claim 15, wherein the gate dielectric layer comprises voids distributed in the at least one concave.

* * * * *